United States Patent
Pan et al.

(10) Patent No.: US 6,436,831 B1
(45) Date of Patent: *Aug. 20, 2002

(54) METHODS OF FORMING INSULATIVE PLUGS AND OXIDE PLUG FORMING METHODS

(75) Inventors: Pai-Hung Pan; Whonchee Lee, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/528,740

(22) Filed: Mar. 20, 2000

Related U.S. Application Data

(63) Continuation of application No. 09/146,765, filed on Sep. 3, 1998, now Pat. No. 6,093,652.
(51) Int. Cl.[7] .............................................. H01L 21/302
(52) U.S. Cl. ...................................... 438/692; 438/424
(58) Field of Search .............................. 438/692, 753, 438/756, 424, 437

(56) References Cited

U.S. PATENT DOCUMENTS

| 5,244,534 A | 9/1993 | Yu et al. |
| 5,272,117 A | 12/1993 | Roth et al. |
| 5,858,858 A | 1/1999 | Park et al. |
| 5,966,614 A | * 10/1999 | Park et al. ............... 438/401 |

* cited by examiner

Primary Examiner—Matthew Smith
Assistant Examiner—Calvin Lee
(74) Attorney, Agent, or Firm—Wells St. John P.S.

(57) ABSTRACT

In one aspect, the invention includes a method of forming an insulative plug within a substrate, comprising: a) forming a masking layer over the substrate, the masking layer having an opening extending therethrough to expose a portion of the underlying substrate; b) etching the exposed portion of the underlying substrate to form an opening extending into the substrate; c) forming an insulative material within the opening in the substrate, the insulative material within the opening forming an insulative plug within the substrate; d) after forming the insulative material within the opening, removing the masking layer; and e) after removing the masking layer, removing a portion of the substrate to lower an upper surface of the substrate relative to the insulative plug.

17 Claims, 6 Drawing Sheets

US 6,436,831 B1

METHODS OF FORMING INSULATIVE PLUGS AND OXIDE PLUG FORMING METHODS

RELATED PATENT DATA

This patent is a continuation application of U.S. patent application Ser. No. 09/146,765 which was filed on Sep. 3, 1998, now U.S. Pat. No. 6,093,652.

TECHNICAL FIELD

The invention pertains to methods of forming insulative plugs, and can have particular application to methods of forming isolation regions, such as, for example, shallow trench isolation regions.

BACKGROUND OF THE INVENTION

In modern semiconductor device applications, numerous individual devices are packed onto a single small area of a semiconductor substrate. Many of these individuals devices need to be electrically isolated from one another. One method of accomplishing such isolation is to form a trenched isolation region between adjacent devices. Such trenched isolation region will generally comprise a trench or cavity formed within the substrate and filled with an insulative material, such as, for example, silicon dioxide. Trench isolation regions are commonly divided into three categories: shallow trenches (trenches less -than about one micron deep); moderate depth trenches (trenches of about one to about three microns deep); and deep trenches (trenches greater than about three microns deep).

Prior art methods for forming trench structures are described with reference to FIGS. 1–9. Referring to FIG. 1, a semiconductor wafer fragment 10 is shown at a preliminary stage of a prior art processing sequence. Wafer fragment 10 comprises a semiconductive material 12 upon which is formed a layer of oxide 14, a layer of nitride 16, and a patterned layer of photoresist 18. Semiconductive material 12 commonly comprises monocrystalline silicon which is lightly doped with a conductivity-enhancing dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Semiconductive material 12 comprises an upper surface 15. Oxide layer 14 is formed over upper surface 15 and typically comprises silicon dioxide. Nitride layer 16 is formed over oxide layer 14 and typically comprises silicon nitride. Oxide layer 14 is typically from about 50 Angstroms to about 300 Angstroms thick, and nitride layer 16 is generally from about 400 Angstroms thick to about 2000 Angstroms thick.

Referring to FIG. 2, patterned photoresist layer 18 is used as a mask for an etching process. The etch is typically conducted utilizing dry plasma conditions and $CH_2F_2/CF_4$ chemistry. Such etching effectively etches both silicon nitride layer 16 and pad oxide layer 14 to form openings 20 extending therethrough to expose a portion of substrate 12. The etching stops upon reaching silicon substrate 12. After the etch of nitride layer 16, nitride layer 16 becomes a masking layer for subsequent processing of wafer fragment 10.

Referring to FIG. 3, a second etch is conducted to extend openings 20 into silicon substrate 12. The second etch is commonly referred to as a "trench initiation etch." A purpose of such trench initiation etch can be to clean an exposed surface of silicon substrate 12 within openings 20 (i.e., to remove defects and polymer material) prior to final trenching into substrate 12. The trench initiation etch is typically a timed dry plasma etch utilizing $CF_4$/HBr. The trench initiation etch typically extends openings 20 to less than or equal to about 500 Angstroms into substrate 12.

Referring to FIG. 4, a third etch is conducted to extend openings 20 further into substrate 12 and thereby form trenches within substrate 12. The third etch typically utilizes an etchant consisting entirely of HBr, and is typically a timed-etch. The timing of the etch is adjusted to form trenches within substrate 12 to a desired depth. For instance, if openings 20 are to be shallow trenches, the third etch will be timed to extend openings 20 to a depth of less than or equal to about one micron.

Referring to FIG. 5, photoresist layer 18 (FIG. 4) is removed, and an oxide material 24 is formed within opening 20 (FIG. 4) and over nitride layer 16. Oxide material 24 can be formed by, for example, initially forming a thin layer of oxide (50 Angstroms to 150 Angstroms thick) through thermal oxidation of substrate 12 within opening 20 (FIG. 4), and subsequently providing high-density plasma oxide to fill opening 20 and overlie nitride layer 16.

Referring FIG. 6, wafer fragment 10 is subjected to planarization (such as, for example, chemical-mechanical polishing) to planarize an upper surface of oxide material 24 (FIG. 5). Nitride layer 16 functions as an etch-stop during such planarization. The oxide material 24 (FIG. 5) remaining within opening 20 (FIG. 4) after the planarization is an oxide plug 30.

Referring to FIG. 7, nitride layer 16 (FIG. 6) is removed. An exemplary process for removing layer 16 is a wet etch utilizing HF, followed by hot $H_3PO_4$.

Referring to FIG. 8, oxide layer 14 (FIG. 7) is removed. An exemplary process for removing layer 14 is a wet etch utilizing HF. As shown, the wet etch has removed portions of oxide plug 30 to recess edges of plug 30 beneath upper surface 15 of substrate 12. Accordingly, gaps 32 are formed between upper surface 15 of substrate 12 and oxide plug 30. More specifically, insulative plug 30 comprises peripheral sidewalls 35 having portions 40 extending below substrate upper surface 15 of substrate 12 and portions 42 above upper surface 15. Portions 40 comprise lower segments 44 which are against substrate 12 and upper segments 46 which are separated from substrate 12 by gaps 32.

Referring to FIG. 9, an oxide layer 34 is grown over upper surface 15 (by, for example, thermal oxidation), and a polysilicon layer 38 is formed over oxide layer 34. Polysilicon layer 38 can be formed by, for example, chemical vapor deposition. Polysilicon layer 38 can ultimately be formed into a wordline comprising transistor gate regions adjacent oxide plug 30. Plug 30 then functions as a trenched isolation region. Gaps 32 can undesirably result in formation of parasitic devices adjacent the transistor devices and ultimately have an effect of lowering a threshold voltage for the transistor devices. Accordingly, it would be desirable to alleviate gaps 32. Gaps 32 can also interfere with subsequent fabrication processes. For this reason as well, it would be desirable to alleviate gaps 32.

SUMMARY OF THE INVENTION

In one aspect, the invention encompasses a method of forming an insulative plug within a substrate. A masking layer is formed over the substrate. The masking layer has an opening extending therethrough to expose a portion of the underlying substrate. The exposed portion of the underlying substrate is etched to form an opening extending into the substrate. An insulative material is formed within the opening in the substrate. The insulative material within the opening forms an insulative plug within the substrate. After forming the insulative material within the opening, he masking layer is removed. After removing the masking layer, a portion of the substrate is removed to lower an upper surface of the substrate relative to the insulative plug.

In another aspect, the invention encompasses an oxide plug forming method. A silicon nitride layer is formed over a substrate. The silicon nitride layer has an opening extending therethrough to expose a portion of the underlying substrate. The exposed portion of the underlying substrate is etched to form an opening extending into the substrate. The opening in the substrate is filled with oxide. The oxide extends ii over the nitride layer. The oxide is planarized. The planarizing removes the oxide from over the nitride layer and leaves some of the oxide remaining within the opening. The oxide remaining within the opening is an oxide plug. After the planarizing, the silicon nitride layer is removed. After removing the silicon nitride layer, a portion of the substrate is removed to lower an upper surface of the substrate relative to the oxide plug.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A method of the present invention is described with reference to FIGS. 10 and 11. In describing FIGS. 10 and 11, similar numbering to that utilized above in describing prior art FIGS. 1–9 will be used, with differences indicated by the suffix "a" or by new numbers.

Figure 1:
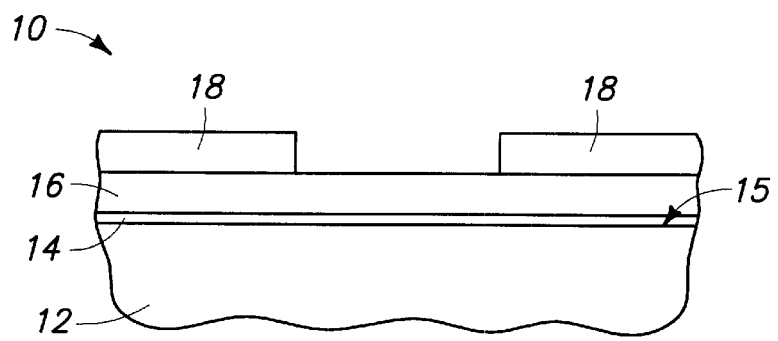
FIG. 1 is a diagrammatic, cross-sectional, fragmentary view of a S semiconductor wafer fragment at a preliminary stage of a prior art processing sequence.
Figure 2:
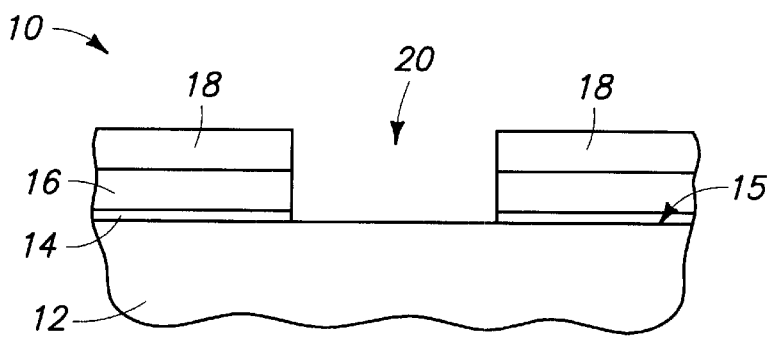
FIG. 2 shows the FIG. 1 wafer fragment at a prior art processing step subsequent to the step of FIG. 1.
Figure 3:
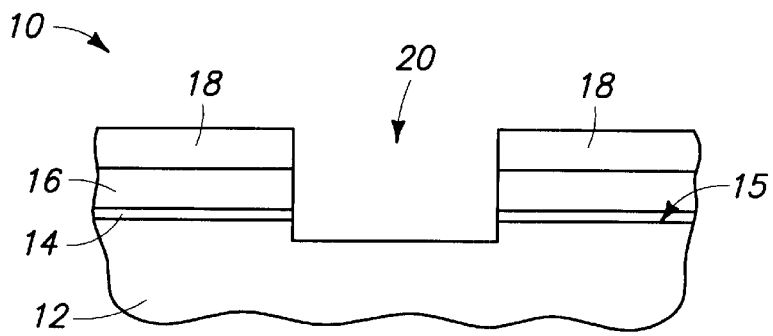
FIG. 3 shows the FIG. 1 wafer fragment at a prior art processing step subsequent to the step of FIG. 2.
Figure 4:
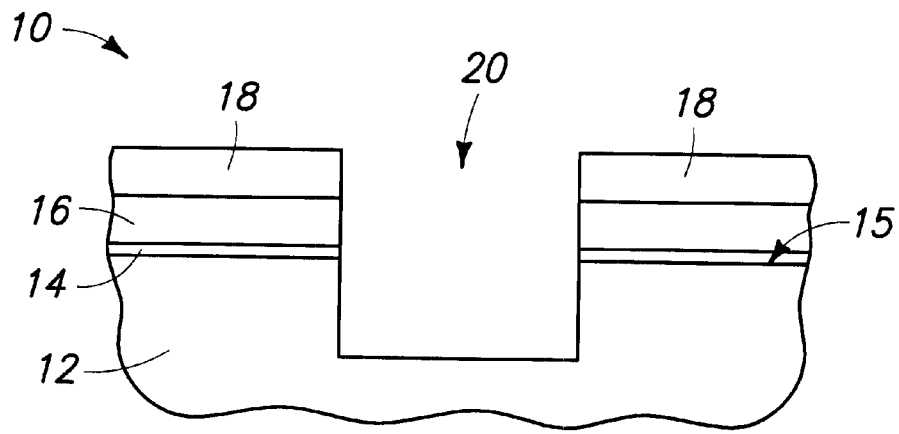
FIG. 4 shows the FIG. 1 wafer fragment at a prior art processing step subsequent to the step of FIG. 3.
Figure 5:
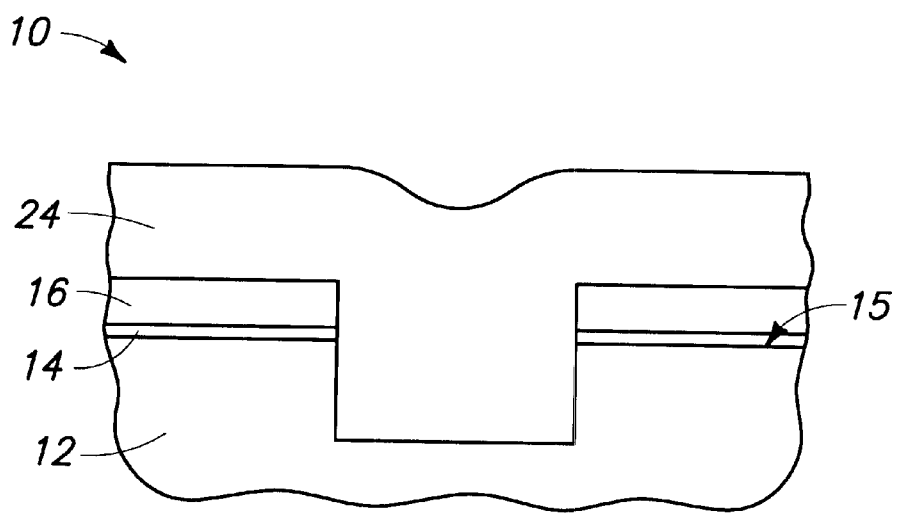
FIG. 5 shows the FIG. 1 wafer fragment at a prior art processing step subsequent to the step of FIG. 4.
Figure 6:
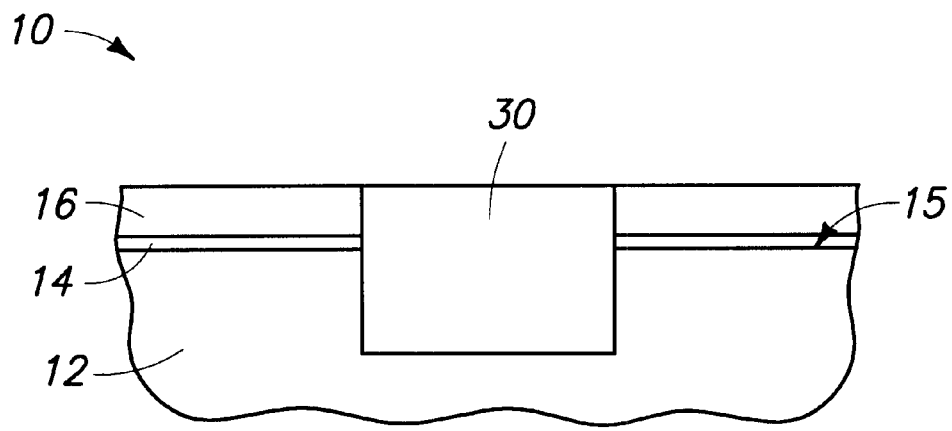
FIG. 6 shows the FIG. 1 wafer fragment at a prior art processing step subsequent to the step of FIG. 5.
Figure 7:
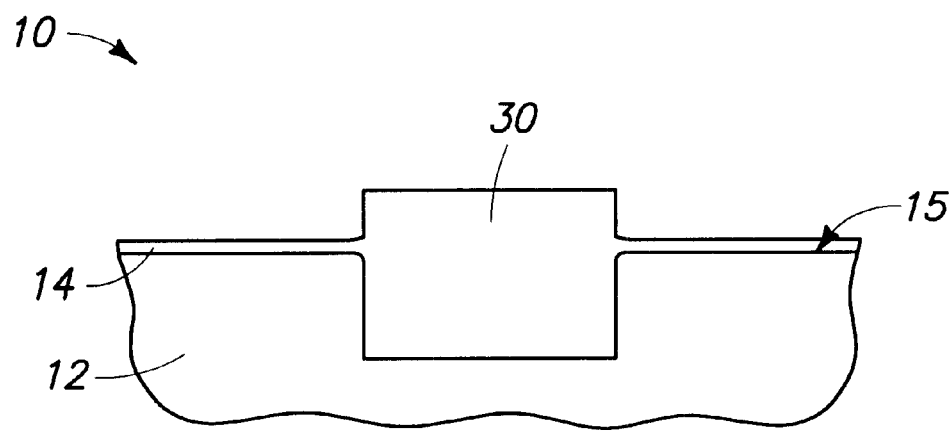
FIG. 7 shows the FIG. 1 wafer fragment at a prior art processing step subsequent to the step of FIG. 6.
Figure 8:
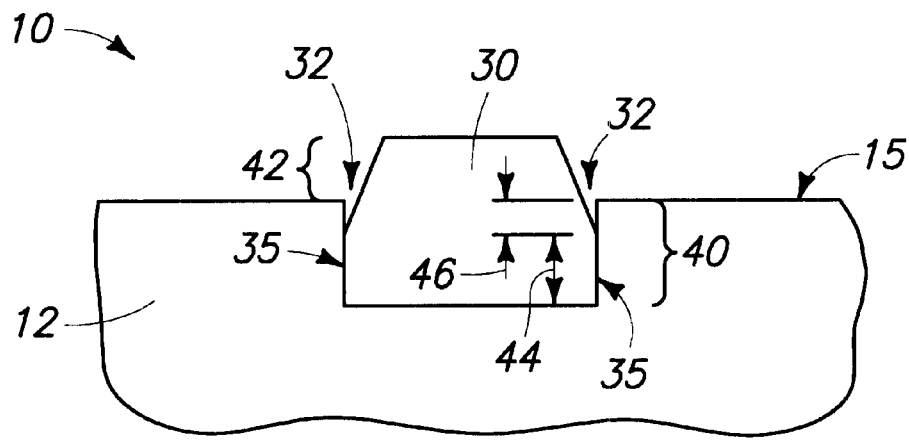
FIG. 8 shows the FIG. 1 wafer fragment at a prior art processing step subsequent to the step of FIG. 7.
Figure 9:
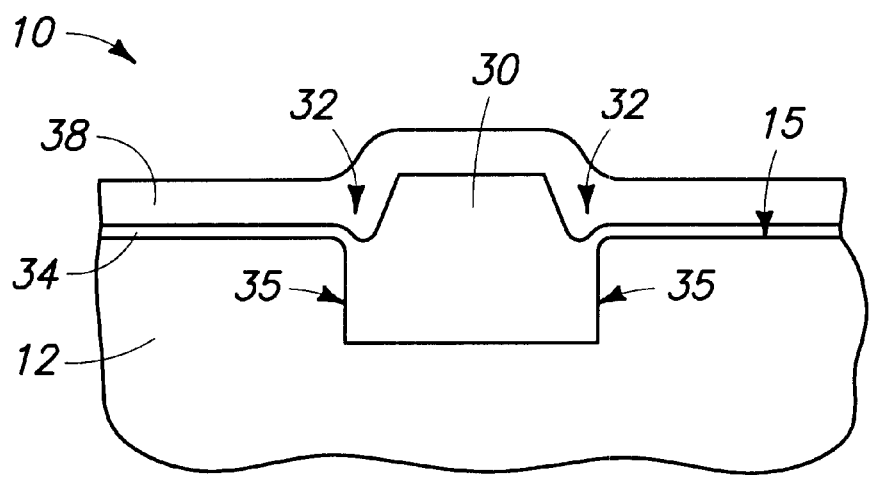
FIG. 9 shows the FIG. 1 wafer fragment at a prior art processing step subsequent to the step of FIG. 8.
Figure 10:
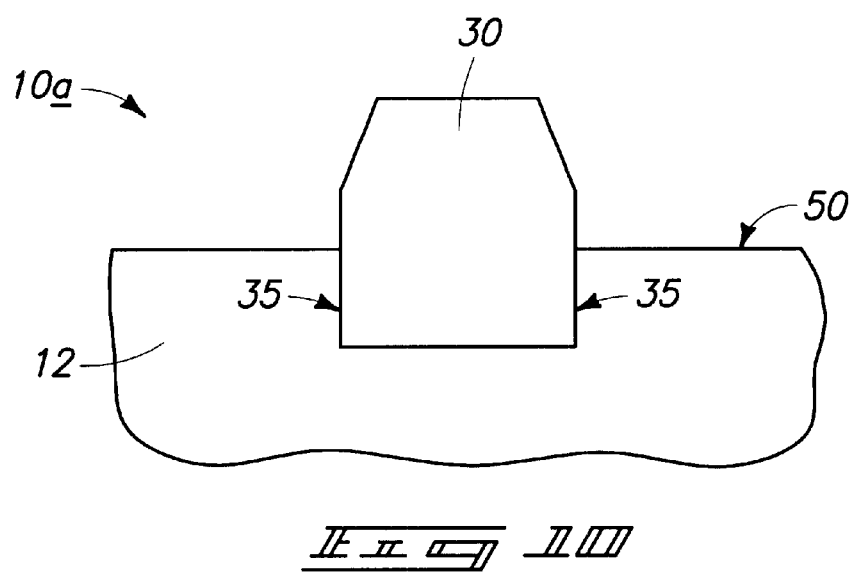
FIG. 10 is a diagrammatic, fragmentary, cross-sectional view of a semiconductor wafer fragment processed according to a method of the present invention, and shown at a step subsequent to the prior art processing step of FIG. 8.

Referring to FIG. 10, a semiconductor wafer fragment 10a is illustrated at a processing step subsequent to the prior art processing step of FIG. 8. Wafer fragment 10a comprises substrate 12 and insulative plug 30. Wafer fragment 10a of FIG. 10 is shown at a processing step analogous to that of wafer fragment 10 of FIG. 9. However, a difference between wafer fragment 10a of FIG. 10 and wafer fragment 10 of FIG. 9 is that wafer fragment 10a has been subjected to processing to remove a portion of substrate 12 and thereby lower an upper surface of substrate 12. Specifically, substrate 12 of wafer fragment 10a comprises an upper surface 50 which is elevationally lower than upper surface 15 of wafer fragment 10. Accordingly, gaps 32 (FIG. 8) are eliminated.

The removal of a portion of substrate 12 is preferably accomplished with an etch selective for the material of substrate 12 relative to the material of plug 30. For instance, in embodiments wherein substrate 12 comprises monocrystalline silicon and insulative plug 30 comprises silicon dioxide, substrate 12 can be selectively etched with a mixture of $H_2O_2$ and HF. An exemplary mixture can be formed by mixing 30 wt. % $H_2O_2$ with 49 wt. % HF in a ratio of from about 1000:1 to about 100:1 ($H_2O_2$:HF, by volume), with the ratio preferably being about 300:1. The selective etching of monocrystalline silicon substrate 12 to silicon oxide plug 30 can be accomplished at atmospheric pressure and about room temperature (i.e., about 21° C.).

Figure 11:
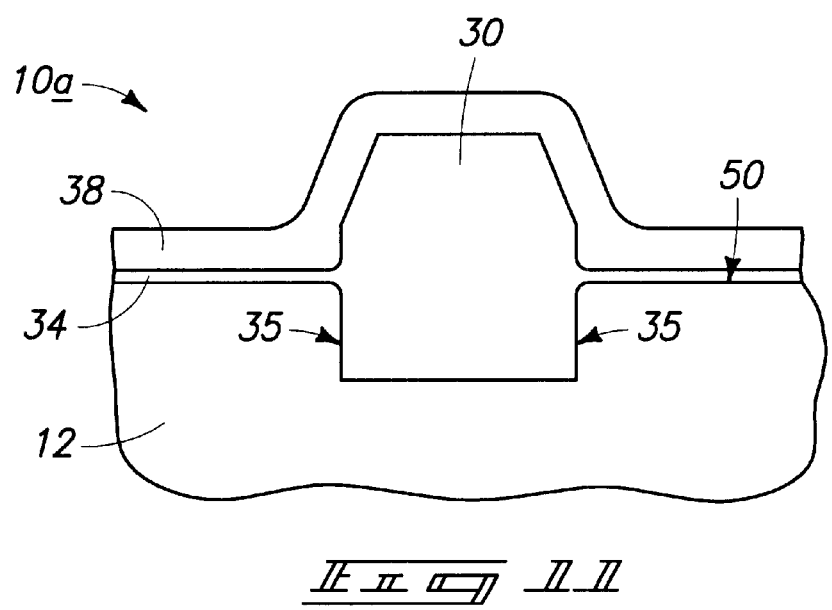
FIG. 11 shows the FIG. 10 wafer fragment at a processing step subsequent to the step of FIG. 10, in accordance with a first embodiment process.

FIG. 11 shows semiconductive wafer fragment 10a after subsequent processing to form oxide layer 34 and polysilicon layer 38 over substrate 12. Polysilicon layer 38 can be utilized for formation of transistor devices adjacent insulative plug 30, with insulative plug 30 being an isolation region between the transistor devices. The processing of FIGS. 10 and 11 has alleviated (shown as elimination) gaps 32 of the prior art isolation regions. Such alleviation of gaps 32 can avoid prior art problems associated with gaps 32, such as, for example, the prior art problems discussed in the "Background" section of this disclosure.

A second embodiment method of processing the semiconductive wafer fragment of FIG. 10 is described with reference to FIGS. 12 and 13. In describing embodiment of FIGS. 12 and 13, similar numbering to that utilized above in describing FIGS. 10 and 11 will be used, with differences indicated by the suffix "b".

Figure 12:
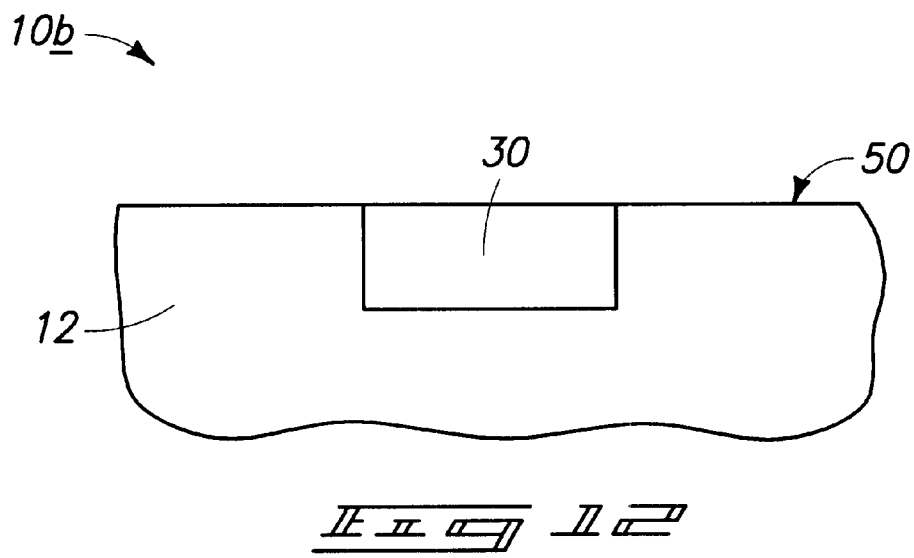
FIG. 12 shows the FIG. 10 wafer fragment at a processing step subsequent to the step of FIG. 10, in accordance with a first embodiment process.

FIG. 12 illustrates a semiconductive wafer fragment 10b at a processing step subsequent to that of FIG. 10. Specifically, wafer fragment 10b corresponds to a processing step subsequent to the wafer fragment 10a of FIG. 10 being subjected to a polishing process to remove an upper portion of insulative plug 30. Such polishing process can comprise, for example, chemical-mechanical polishing. In the shown embodiment, the polishing process has planarized a material of insulative plug 30 until insulative plug 30 has an upper surface at about a same elevational level as upper surface 50 of substrate 12. However, it is to be understood that the invention encompasses other embodiments (not shown) wherein the polishing of insulative plug 30 results in an upper surface of insulative plug 30 that is elevationally above upper surface 50 of substrate 12. The invention can encompass yet other embodiments (not shown) wherein the insulative plug 30 is etched until it comprises an upper surface that is elevationally above upper surface 50 of substrate 12.

Figure 13:
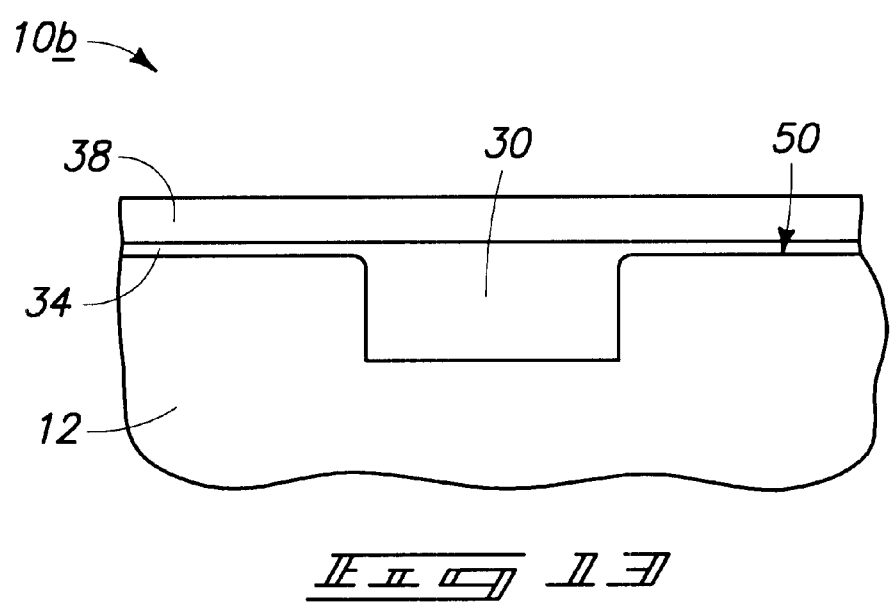
FIG. 13 shows the FIG. 10 wafer fragment at a processing step subsequent to the step of FIG. 12.

Referring to FIG. 13, an oxide layer 34 is formed over upper surface 50 of substrate 12, and a polysilicon layer 38 is formed over oxide layer 34. As in the embodiment of FIG. 11, polysilicon layer 38 can be utilized for formation of transistor devices adjacent insulative plug 30, with insulative plug 30 being an isolation region between the transistor devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an isolation region within a silicon-comprising substrate, comprising:

forming an insulative material plug within an opening in a silicon-comprising substrate, the insulative material having an outermost surface extending outwardly of a surface of the substrate that is beside the insulative material;

removing a portion of the substrate to lower the surface of the substrate relative to the insulative material plug;

wherein, before the removing the portion of the substrate, the insulative material plug comprises a portion extending below the surface of the substrate, said portion of the insulative plug comprising a peripheral sidewall, the peripheral sidewall comprising a lower segment against the substrate and an upper segment separated from the substrate by a gap; and wherein the removing a portion of the substrate lowers the surface of the substrate to below the upper segment.

2. A method of forming a silicon dioxide isolation region within a monocrystalline silicon substrate, comprising:

forming a silicon dioxide plug within an opening in a monocrystalline silicon substrate, the silicon dioxide plug having an outermost surface extending outwardly of a proximate surface of the substrate, the silicon dioxide plug also having a sidewall within the opening, at least part of the sidewall being separated from the substrate by a gap; and while the outermost surface of the silicon dioxide plug extends outwardly of a proximate surface of the substrate, removing a portion of the monocrystalline silicon substrate with an etch selective for monocrystalline silicon relative to the silicon dioxide of the plug to lower the proximate surface of the substrate relative to the silicon dioxide plug, wherein the removing a portion of the substrate exposes some of said sidewall.

3. The method of claim 2 wherein the proximate surface of the substrate is an outermost surface of the substrate.

4. A method of forming an isolation region within a substrate, comprising:

forming a silicon dioxide plug within an opening in a monocrystalline silicon substrate, the plug having an outermost surface extending outwardly of a surface of the substrate, and having a sidewall within the opening, a portion of the sidewall being separated from the substrate by a gap;

while the outermost surface of the silicon dioxide plug extends outwardly of a proximate surface of the substrate, removing a portion of the substrate to lower the surface of the substrate relative to the plug outermost surface, and after removing the portion of the substrate, polishing the plug to lower the outermost surface of the plug relative to the surface of the substrate.

5. A method of forming an isolation region within a silicon-comprising substrate, comprising:

forming a masking layer over the silicon-comprising substrate and having an opening extending therethrough exposing a portion of the underlying substrate, wherein the masking layer comprises nitride;

etching the exposed portion of the underlying substrate to form an opening extending into the substrate;

forming an insulative material within the opening in the substrate to form an insulative plug;

after forming the insulative material within the opening, removing the masking layer; and after removing the masking layer, removing a portion of the substrate to lower an upper surface of the substrate relative to the insulative plug, wherein before the removing the portion of the substrate, the insulative plug comprises a portion extending below an upper surface of the substrate, said portion of the insulative plug comprising a peripheral sidewall, the peripheral sidewall comprising a lower segment against the substrate and an upper segment separated from the substrate by a gap; and wherein the removing a portion of the substrate lowers the upper surface of the substrate to below the upper segment.

6. The method of claim 5 wherein the forming the insulative material within the opening in the substrate also forms the insulative material over the masking layer; the method further comprising planarizing the insulative material, the planarizing removing the insulative material from over the masking layer.

7. A method of forming an isolation region, comprising:

forming a first material layer over a monocrystalline silicon substrate, the first material layer having an opening extending therethrough to expose a portion of the underlying substrate, the first material not being silicon dioxide;

etching the exposed portion of the underlying substrate to form an opening extending into the substrate;

forming silicon dioxide within the opening in the substrate, the silicon dioxide within the opening forming at least a portion of an isolation region;

after forming the silicon dioxide, selectively removing the first material layer; and after selectively removing the first material layer, removing a portion of the substrate to lower an upper surface of the substrate relative to the isolation region, wherein before the removing the portion of the substrate, the isolation region comprises a portion extending below an upper surface of the substrate, said portion of the isolation region comprising a peripheral sidewall, the peripheral sidewall comprising a lower segment against the substrate and an upper segment separated from the substrate by a gap; and wherein the removing a portion of the substrate lowers the upper surface of the substrate to below the upper segment.

8. The method of claim 7 wherein the removing a portion of the substrate comprises exposing the substrate to $H_2O_2$ and HF.

9. The method of claim 7 wherein the first material layer comprises nitride.

10. A method of forming an isolation region, comprising:

forming a first material layer over a substrate and having an opening extending therethrough exposing a portion of the underlying substrate, the first material not being silicon dioxide;

etching the exposed portion of the underlying substrate to form an opening extending into the substrate;

filling the opening in the substrate with silicon dioxide, the silicon oxide extending over the first material layer;

planarizing the silicon dioxide, the planarizing removing the silicon dioxide from over the first material layer and leaving some of the silicon dioxide remaining within the opening, the silicon dioxide remaining within the opening being a silicon dioxide plug;

after the planarizing, removing the first material layer; and after removing the first material layer, removing a portion of the substrate to lower an upper surface of the substrate relative to the silicon dioxide plug wherein before the removing the portion of the substrate, the silicon dioxide plug comprises a portion extending below an upper surface of the substrate, said portion of the silicon dioxide plug comprising a peripheral sidewall, the peripheral sidewall comprising a lower segment against the substrate and an upper segment separated from the substrate by a gap; and wherein the removing a portion of the substrate lowers the upper surface of the substrate to below the upper segment.

11. The method of claim 10 further comprising, after removing the portion of the substrate, polishing the plug to lower an upper surface of the plug relative to the proximate surface of the substrate.

12. The method of claim 10 further comprising, forming transistor devices adjacent the silicon dioxide plug, the silicon dioxide plug being an isolation region between the transistor devices.

13. The method of claim 10 wherein the silicon dioxide plug extends to a depth of less than about 1 micron into the substrate; the method further comprising, forming transistor devices adjacent the silicon dioxide plug, the silicon dioxide plug being a shallow trench isolation region between the transistor devices.

14. The method of claim 10 wherein the substrate comprises silicon.

15. The method of claim 10 wherein the substrate comprises monocrystalline silicon.

16. The method of claim 10 wherein the removing a portion of the substrate comprises exposing the substrate to $H_2O_2$ and HF.

17. The method of claim 10 wherein the substrate comprises silicon, and wherein the removing a portion of the substrate comprises exposing the substrate to $H_2O_2$ and HF.

* * * * *

UNITED STATES PATENT AND TRADEMARK OFFICE
CERTIFICATE OF CORRECTION

PATENT NO.    : 6,436,831 B1
DATED         : August 20, 2000
INVENTOR(S)   : Pan et al.

It is certified that error appears in the above-identified patent and that said Letters Patent is hereby corrected as shown below:

Column 2,
Line 8, replace "$CF_4IHBr$" with -- $CF_4/HBr$ --.
Line 28, replace "Referring" with -- Referring to --.

Column 3,
Line 8, replace "he" with -- the --.
Line 18, remove "ii".
Line 31, remove "S".

Signed and Sealed this

Twenty-fifth Day of February, 2003

JAMES E. ROGAN
*Director of the United States Patent and Trademark Office*